(12) United States Patent
Muravev et al.

(10) Patent No.: US 11,037,747 B2
(45) Date of Patent: Jun. 15, 2021

(54) DEVICE FOR THE FAIL-SAFE DISCONNECTION OF A CONSUMER

(71) Applicant: PILZ GMBH & CO. KG, Ostfildern (DE)

(72) Inventors: Dmitry Muravev, Ostfildern (DE); Klaus Jörg Dannenmann, Ostfildern (DE)

(73) Assignee: Pilz GmbH & Co. KG, Ostfildern (DE)

(*) Notice: Subject to any disclaimer, the term of this patent is extended or adjusted under 35 U.S.C. 154(b) by 204 days.

(21) Appl. No.: 16/202,754

(22) Filed: Nov. 28, 2018

(65) Prior Publication Data
US 2019/0096615 A1    Mar. 28, 2019

Related U.S. Application Data

(63) Continuation of application No. PCT/EP2017/062648, filed on May 24, 2017.

(30) Foreign Application Priority Data

May 30, 2016   (DE) .......................... 102016109915.5

(51) Int. Cl.
*H01H 47/00*    (2006.01)
*G01R 31/327*   (2006.01)
(Continued)

(52) U.S. Cl.
CPC ....... *H01H 47/002* (2013.01); *G01R 31/3278* (2013.01); *H01H 47/005* (2013.01);
(Continued)

(58) Field of Classification Search
CPC .......................... H01H 47/002; G01R 31/3278
See application file for complete search history.

(56) References Cited

U.S. PATENT DOCUMENTS 6,628,015 B2 * 9/2003 Pullmann .................. F16P 3/00
                                                    307/326
6,787,940 B2 * 9/2004 Pullmann ................. G05B 9/03
                                                    307/326
(Continued)

FOREIGN PATENT DOCUMENTS

CN        1795522 A    6/2006
CN      101180698 A    5/2008
(Continued)

OTHER PUBLICATIONS

International Search Report for PCT/EP2017/062648; dated Aug. 28, 2017; 2 pp.
(Continued)

*Primary Examiner* — Walter L Lindsay, Jr.
*Assistant Examiner* — Milton Gonzalez
(74) *Attorney, Agent, or Firm* — Harness, Dickey & Pierce, P.L.C.

(57) ABSTRACT

A safety switching device for the fail-safe disconnection of an external consumer has an internal consumer and switching elements for connecting in parallel the internal consumer with the external consumer. Read-back taps are arranged between the switching elements, a first and second pole of the external consumer, and the internal consumer. A signal processing unit includes a testing device and a memory, in which a first error pattern set is stored. The testing device is coupled to the read-back taps and executes a switching test having a minimum of three temporally-separated test intervals. In each test interval, the testing device receives a read-back signal from each read-back tap in order to generate a first test pattern. To identify a fault, the testing device matches the first test pattern with the first error pattern set.

19 Claims, 6 Drawing Sheets

(51) Int. Cl.
  *H02H 1/00* (2006.01)
  *H02H 7/16* (2006.01)
  *H02H 7/22* (2006.01)
  *G05B 9/02* (2006.01)
(52) U.S. Cl.
  CPC ........ *H02H 1/0007* (2013.01); *H02H 1/0092* (2013.01); *H02H 7/16* (2013.01); *H02H 7/222* (2013.01); *G05B 9/02* (2013.01)

(56) References Cited

U.S. PATENT DOCUMENTS

| | | | | |
|---|---|---|---|---|
| 7,130,171 | B2* | 10/2006 | Pullmann | G05B 9/03 361/62 |
| 7,187,091 | B2* | 3/2007 | Veil | F16P 3/00 307/326 |
| 7,623,326 | B2 | 11/2009 | Schwenkel et al. | |
| 7,656,629 | B2* | 2/2010 | Pullmann | H01H 47/002 361/62 |
| 7,672,109 | B2* | 3/2010 | Nitsche | H01H 47/002 361/115 |
| 7,898,118 | B2* | 3/2011 | Nitsche | H01H 47/005 307/326 |
| 7,948,391 | B2* | 5/2011 | Pullmann | H01H 47/002 340/679 |
| 9,852,852 | B2* | 12/2017 | Le | H01H 9/0271 |
| 9,892,878 | B2 | 2/2018 | Veil et al. | |
| 2004/0160131 | A1 | 8/2004 | Veil et al. | |
| 2006/0077613 | A1 | 4/2006 | Hornung | |
| 2008/0067876 | A1 | 3/2008 | Nitsche et al. | |
| 2009/0295321 | A1 | 12/2009 | Okamoto et al. | |
| 2010/0259862 | A1 | 10/2010 | Veil | |
| 2011/0134573 | A1 | 6/2011 | Haller | |
| 2015/0340854 | A1 | 11/2015 | Richter et al. | |

FOREIGN PATENT DOCUMENTS

| | | |
|---|---|---|
| DE | 10351873 A1 | 6/2005 |
| DE | 102012203939 A1 | 9/2013 |
| DE | 102013101932 A1 | 8/2014 |
| EP | 2149826 A1 | 2/2010 |
| JP | 2005501200 A | 1/2005 |
| JP | 2016513444 A | 5/2016 |
| WO | WO-2006002725 A1 | 1/2006 |

OTHER PUBLICATIONS

English translation of Chinese Examination Report for Appl'n No. 201780040681.6; dated Jul. 3, 2019; 6 pp.

English translation of International Preliminary Report on Patentability (Chapter 1) for PCT/EP2017/062648; dated Dec. 4, 2018; 6 pp.

* cited by examiner

DEVICE FOR THE FAIL-SAFE DISCONNECTION OF A CONSUMER

CROSS-REFERENCES TO RELATED APPLICATIONS

This application is a continuation of international patent application PCT/EP2017/062648, filed on May 24, 2017 designating the U.S., which international patent application has been published in German language under WO 2017/207403 and claims priority from German patent application DE 10 2016 109 915.5, filed on May 30, 2016. The entire contents of these priority applications are incorporated herein by reference.

BACKGROUND OF THE INVENTION

The present disclosure relates to safety systems for fail-safely monitoring the operation of automated installations, and in particular to a device for the fail-safe shutdown of an external consumer and to a corresponding method.

A device and a method of the generic kind are known from DE 103 51 873 A1.

Devices of the generic kind are employed for the reliable, i.e. fail-safe, shutdown of a technical installation in the event of a hazard situation. Specifically, devices of the generic kind are suitable for the shutdown of a consumer from both poles of a supply voltage. In specialized terminology, a connection of this type is described as a two-pole connection, and ensures that both capacitive and inductive consumers, for example solenoid valves, can be safely and reliably disconnected.

From DE 103 51 873 A1, it is known that devices of the generic kind, in order to satisfy the requirements of applicable safety standards, execute regular self-testing, in order to verify their own functional capability. In addition to the detection of the presence of a fault, devices of the generic kind can also indicate, to a limited extent, the nature of the fault concerned.

In the light of increasing automation, wherein devices of the generic kind are predominantly no longer employed in isolation, but are regularly interconnected, the identification of the nature of the fault concerned is of increasing significance. Moreover, the increased networking of generic devices requires that devices should preferably be monitored and evaluated from a central location. To this end, it is necessary that devices should not only ensure the safe shutdown of an installation to be monitored, in the event of a fault, but that devices should also provide the most accurate and detailed indication and notification possible of the nature of the fault concerned. Specifically, a device must be capable of distinguishing between the presence of an internal fault, i.e. a fault of the device itself, or an external fault, for example a wiring fault or a load interruption, since the device must be switched to a fail-safe condition in accordance with the nature of the fault.

SUMMARY OF THE INVENTION

It is an object of the present disclosure to provide a device and a method of the aforementioned type, whereby faults of the device can be detected more effectively and more efficiently. Further, it is an object of the present disclosure to provide a device and a method which, by self-testing, can unambiguously identify more faults than known devices. Yet further, it is an object of the present disclosure to provide a device which can distinguish more effectively between internal and external faults. Yet further, it is an object to provide a device and a method which permits central evaluation and diagnosis.

According to an aspect of the present disclosure there is provided a safety switching device for the fail-safe shutdown of an external consumer having a first pole and a second pole, comprising a first terminal for receiving a first potential, a second terminal for receiving a second potential, a first switching element arranged between the first terminal and the first pole of the external consumer, a second switching element arranged between the second terminal and the second pole of the external consumer, a signal processing unit for receiving a switch-off signal via an input and for actuating the first and second switching element in accordance with the switch-off signal, an internal consumer, and a third switching element for connecting in parallel the internal consumer with the external consumer, wherein a first read-back tap is arranged between the first switching element and the first pole, a second read-back tap is arranged between the second switching element and the second pole, and a third read-back tap is arranged between the third switching element and the internal consumer, wherein the signal processing unit comprises a testing device and a memory, in which a first error pattern set is stored, wherein the testing device is coupled to the first, second and third read-back tap and is configured to execute a first switching test having a minimum of three temporally-separated test intervals, wherein the testing device is configured to receive, in each test interval, a read-back signal from the first, second and third read-back tap respectively in order to generate a first test pattern, and wherein the testing device is further configured to find a match of the first test pattern within the first error pattern set, in order to identify a fault.

According to a further aspect of the present disclosure there is provided a method for the fail-safe disconnection of an external consumer having a first pole which, via a first switching element, is coupled to a first terminal for receiving a first potential, and having a second pole which, via a second switching element, is connected to a second terminal for receiving a second potential, wherein the method comprises the steps of:
  receiving a switch-off signal;
  actuating the first and second switching elements, in accordance with the switch-off signal;
  providing an internal consumer and a third switching element, wherein the internal consumer, by actuating the third switching element, is connected in parallel with the external consumer;
  providing a first, a second and a third read-back tap between the first, second and third switching elements and the external and internal consumers;
  providing a first error pattern set;
  executing a first switching test over a minimum of three temporally-separated time intervals;
  generating a first test pattern by the read-back of one read-back signal respectively on the first, second and third read-back tap in each of the at least three temporally-separated time intervals; and
  identifying a fault by finding a match of the first test pattern within the first error pattern set.

The safety switching device according to this disclosure thus incorporates a testing device for identifying faults of the safety switching device. The testing device can be configured as a separate system, as an element of the signal processing unit, or as a software application. The testing device can thus, moreover, be specifically configured as a control program or an element of the control program, by means of which, during signal processing, the input signals present on the inputs are additionally processed.

The safety switching device according to this disclosure is additionally provided with an internal consumer which, by means of a further switching element, can be connected in parallel with the connected external consumer. The internal consumer is configured as a simulated load, i.e. an electronic component or electronic component unit which can simulate the electrical properties of a customary external consumer. The third switching element is configured to connect the simulated load, on one pole, to the first pole of the consumer, whereas the further pole of the simulated load is connected to the second pole of the consumer.

Independently of the preferred implementation, the testing device is thus configured to actuate the first, second and third switching element, for the execution of a switching test. The testing device can thus switch-on or switch-off the first, second and third switching elements, independently of the switch-off signal applied.

By means of read-back taps, the testing device can identify a reaction to actuating the first, second and third switching elements, by receiving read-back signals at the read-back taps. The read-back signals represent the respective voltage on one read-back tap, wherein the voltage can be converted into discrete values by an analogue-digital converter. Specifically, the voltage can be subdivided into two states by means of a threshold value detector, such that the read-back signal is a binary signal which represents said two states.

According to the present disclosure, the aforementioned systems operate in combination such that, in a first switching test, the switching elements are sequentially set to various mutual settings, in the course of which read-back signals are read-off via the read-back taps. The read-back signals are combined to generate a test pattern, which is then compared with the fault patterns stored in the memory, in order to permit the accurate identification of a fault.

By means of a single switching test, various faults on the device can be detected and unambiguously identified in a simple and efficient manner. Specifically, a switching test of this type can be simply executed as an element of a control program, whereby a testing device can be configured in a particularly cost-effective manner. Moreover, the testing device is extendable in a simple manner, in the event that further fault patterns are identified, to which an unambiguous fault can be assigned. Moreover, switching tests can be advantageously and simply combined, in order to permit the implementation of various test strategies, by means of which further faults can be identified. The application of test patterns thus constitutes not only a simpler, but also a more flexible means of checking a safety switching device for faults, and of establishing a diagnosis in the event of a fault. Overall, by the switching test according to the present disclosure, the diagnostic capability of a safety switching device can be advantageously enhanced as a result.

In a preferred refinement, the testing device is designed, after each of the mutually temporally-separated time intervals, to vary at least one switching state of the first, second or third switching elements. By the variation of switching states after each interval, advantageously, all the potential switching states can be comprehensively permutated, such that a test pattern can be generated in a simple manner with respect to all the switching states of the at least first and second switching elements.

In a further refinement, a fault type is unambiguously assigned to each fault pattern in a first error pattern set. By the clear assignment of fault patterns to fault types, a fault on the device can be unambiguously identified, in a simple manner, from the test pattern thus generated.

In a further refinement, the first test pattern is a bit field. A bit field permits exceptionally simple mechanical processing, and can be compared with other bit fields. By means of rapid matching, the duration of a test can be advantageously shortened, whereby the overall response time of the safety switching device can be reduced.

In a further refinement, the testing device is configured to match the first test pattern with a further pattern set, in order to identify fault-free operation. The testing device is thus also able to identify a "good case", i.e. a state in which the safety switching device is operating correctly. The further pattern set can be incorporated in the first error pattern set, in order to permit rapid matching.

In a further refinement, the first switching test comprises four mutually temporally-separated intervals. Thus, by means of four mutually temporally-separated test intervals, in a single test run all the potential switching states to which the first and second switching elements can be mutually set can be tested. Accordingly, a single test pattern can reproduce all the mutual switching states of the first and second switching elements.

In a further refinement, in the first switching test, the testing device is designed, in a first interval, to actuate neither the first nor the second switching elements, in a second interval to actuate only the first switching element, in a third interval to actuate only the second switching element, and in a fourth interval to actuate the first and second switching elements, wherein the third switching element is only actuated in the fourth interval. In this switching test, the first and second switching elements are set to all their potential mutual switching states, wherein the internal consumer is only switched-in if the first and second switching elements are actuated simultaneously. A switching test of this type, in a single test run, permits the checking of devices for short-circuits and cross-connections, and for the presence of a load interruption. In a single test run, the most common faults on a safety switching device with two-pole connection can thus be identified. Moreover, only in a switching test of this type can a "good case" be additionally identified, i.e. a case in which the test pattern represents correct operation. This is the case, if the read-back signals on the read-back taps in the first, second, third and fourth intervals match the anticipated values.

In a further refinement, the testing device is configured to generate a fault signal, which represents the fault type, on the basis of the first switching test, where a fault is unambiguously identified by the first switching test. A fault output thus proceeds immediately upon the detection of a fault. The fault output can include an indication or notification of the fault and/or incorporate the execution of an action, for example the tripping of a safety function. It is understood that, if a "good case" is identified by the first switching test, an output to this effect is generated.

In a further refinement, the first switching test is configurable with respect to the number of mutually temporally-separated time intervals. Thus, the test intervals, and the potential switching states which can be mutually assumed by the first, second and third switching elements, can be configured. Specifically, specific switching states can be avoided which, in consideration of the connected consumer, are not to be assumed. By means of this configuration facility, the safety switching device can be employed in an exceptionally flexible manner for various external consumers.

In a further refinement, the testing device is designed for the execution of a functional test, which precedes the first switching test. By reference to the functional test, the presence of a fault can easily be detected, and it can be determined whether a switching test for the identification of said fault is to be executed, in order to identify the fault. In the subsequent switching test, where the latter identifies a "good case", the result of the functional test can be "overridden" such that, where applicable, the detection of a fault in the functional test does not necessarily result in the shutdown of the outputs, if the subsequent switching test indicates the correct operation of the device. This can have a positive impact upon availability.

In a further refinement, the testing device is designed, for the functional test, to sequentially actuate the first switching element and the second switching element and, upon actuating the first switching element, by means of a read-back at the first read-back tap, to determine the functional capability of the first switching element and, upon actuating the second switching element, by means of a read-back at the second read-back tap, to determine the functional capability of the second switching element. In the functional test, the first and second switching elements are thus sequentially actuated and checked. If a fault is present, a switching test can be executed thereafter. An individual functional test of a switching element can be executed very rapidly, wherein the first and second switching elements can also be checked for safe operation in sequential program cycles.

In a further refinement, the testing device is designed only to execute the first switching test in the event of the detection of a fault in the functional test. By the execution of a switching test only upon the indication of a fault by the functional test, a test sequence can initially be limited to the functional test only, and a further switching test is only executed if required. In this manner, the duration of a test, under normal circumstances, can be very short, such that the response time of the safety switching device is only compromised to a minor extent by the test.

In a further refinement, the testing device is designed for the execution, further to the first switching test, of a second switching test, in order to generate a second test pattern in the event that, further to the first switching test, no fault has been unambiguously identified. By means of the second switching test further faults can unambiguously be identified, if the nature of the fault remains undetermined by the first switching test.

In a further refinement, the testing device is designed, for the second switching test, in a first interval to actuate neither the first nor the second switching elements, in a second interval to actuate only the first switching element, in a third interval to actuate only the second switching element, and in a fourth interval to actuate the first and second switching elements wherein, in the first, second, third and fourth interval, the third switching element is actuated. In this switching test, the first and second switching elements are set to all their potential mutual switching states, wherein the internal consumer is parallel-connected throughout the duration of the switching test. A switching test of this type allows the safety switching device to be checked, in tandem with a load interruption, for any other faults, such as short-circuits or cross-connections, whereby the diagnostic capability of the safety switching device can be further enhanced.

In a further refinement, a second error pattern set is stored in the memory, and the testing device is configured to find a match of the second test pattern within the second error pattern set, in order to permit the unambiguous identification of a fault. By means of the second error pattern set further faults may be identified. Particularly, an error pattern set can be stored for each individual switching test.

In a further refinement, the testing device is configured to generate a fault signal, which represents the fault type, on the basis of the second switching test, if no fault has been unambiguously identified by the first switching test.

In a further refinement, the fault type represents an internal hardware fault, if no fault is unambiguously identified by the second switching test. An internal hardware fault may thus only be assumed if a fault has not been unambiguously identified by any of the preceding tests. An internal hardware fault, as a result of which the safety switching device must be switched to a fail-safe state, is thus only assumed if all known faults have been ruled out.

It is understood that the aforementioned characteristics, and those described hereinafter, are applicable not only in the respective combination indicated, but also in other combinations, or in isolation, without departing from the scope of the present invention.

BRIEF DESCRIPTION OF THE DRAWINGS

Exemplary embodiments of the invention are represented in the drawing, and are described in greater detail in the following description. Herein.

DETAILED DESCRIPTION OF THE PREFERRED EMBODIMENTS

Figure 1:
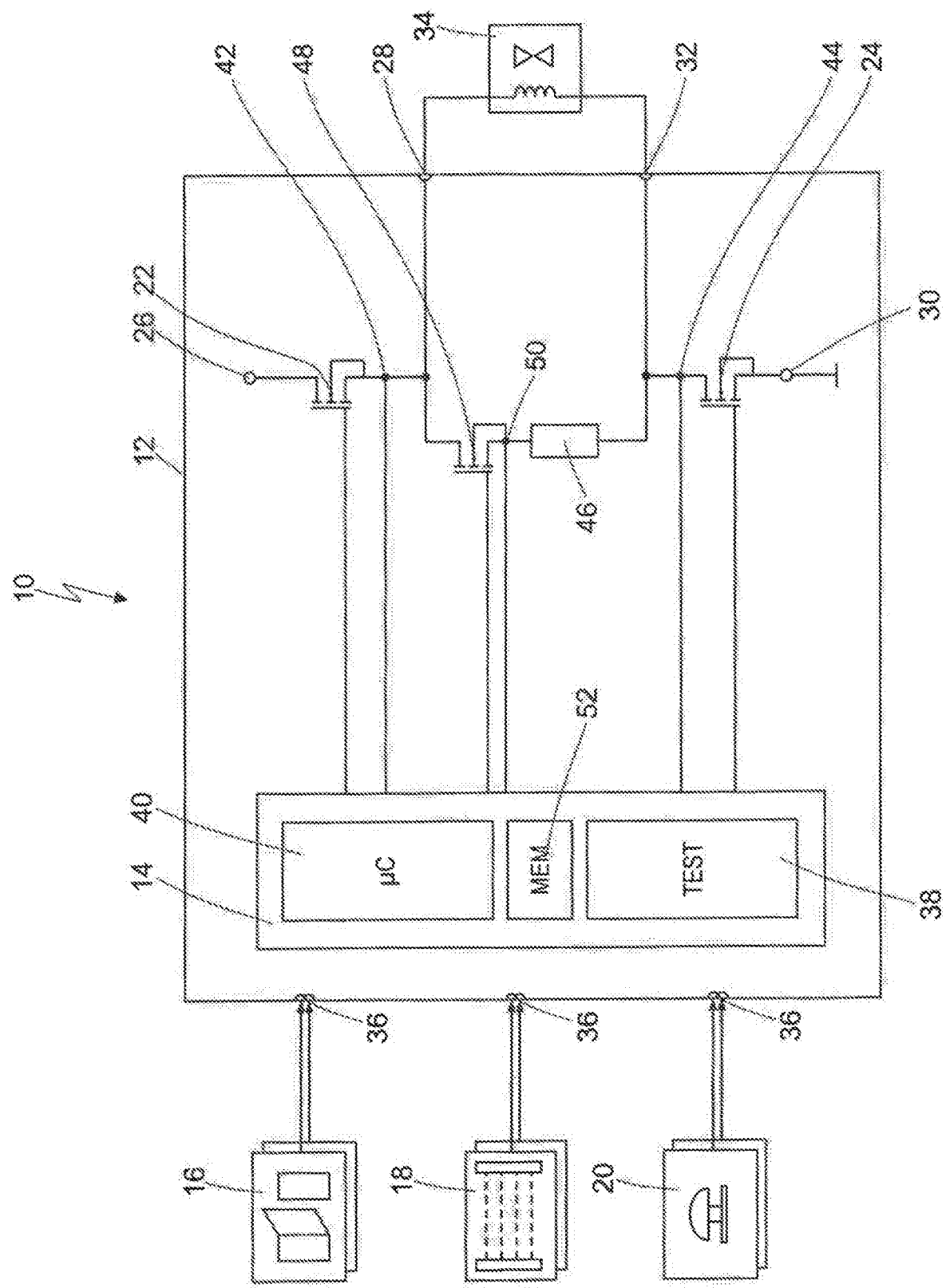
FIG. 1: shows a schematic representation of an exemplary embodiment of a safety switching device.

FIG. 1 shows an exemplary embodiment of the safety switching device in its entirety, designated by the reference number 10. The safety switching device 10 is represented here, for exemplary purposes, as an independently-functional safety switching device, all the functional elements of which are compactly installed in a device housing 12. Alternatively, however, a more complex safety control module could be involved, for example a programmable logic controller (PLC) which is designed for safety purposes. In a further exemplary embodiment (not represented separately here), the safety switching device 10 could be configured with spatially distributed components which are interconnected, for example by means of a bus system.

The safety switching device 10 has a signal processing unit 14. In this case, the signal processing unit 14, in accordance with its anticipated application and the associated safety requirement, is of multi-channel design. Specifically, the signal processing unit 14 can incorporate two microprocessors (not represented separately), which communicate with each other and execute a mutual monitoring function.

On the input side of the safety switching device 10, detector elements can be connected for safety purposes. Safety guards 16, photoelectric barriers 18 and emergency stop switches 20 are represented here for exemplary purposes. The signal processing unit 14 processes the signals from one or more detector elements, in a fail-safe manner which is known per se, and controls one or more output-side switching elements with reference thereto.

In the present case, the safety switching device 10 has two output-side switching elements 22, 24, which are represented here as two MOS transistors. The first switching element 22 connects a first terminal 26, via which a first potential can be delivered to the safety switching device 10, with a first output terminal 28. The second switching element 24 connects a second terminal 30, via which the safety switching device 10 can receive a second potential, with a second output terminal 32.

Between the first and second output terminals 28, 32, an external consumer 34 is connected, which can be disconnected by the safety switching device 10 in a fail-safe manner, according to the signals delivered by the detector elements 16, 18, 20. The consumer 34 is specifically an inductive or capacitive conductor, represented here, for exemplary purposes, as a solenoid valve. For the purposes of fail-safe disconnection, energy-storing consumers of this type must be isolated from a supply voltage on both poles. In specialized terminology, a connection of this type is therefore described as a two-pole connection.

In normal operation, the detector elements 16, 18, 20 actively indicate a safe state on the inputs 36 of the safety switching device 10. In the presence of the corresponding input signals, the signal processing unit 14 actuates the first and the second switching elements 22, 24, such that a current path from the first terminal 26 via the external consumer 34 to the second terminal 30 is closed. The first terminal 26 is thus connected, for example, to an operating voltage $U_B$, and the second terminal 30 to a grounding terminal, such that the supply to the external consumer 34 approximates to the operating voltage $U_B$.

In addition to components which are essential for the purposes of disconnection, the safety switching device 10 also incorporates systems for the verification of these components, and systems for the execution of self-testing. Specifically, the safety switching device 10 incorporates a testing device 38, which executes the corresponding tests.

The testing device 38, as represented here, can constitute a component of the signal processing unit 14. Alternatively, the testing device 38 can also be a standalone unit which is separated from the signal processing unit 14, for example a standalone microcontroller. In another exemplary embodiment, additionally, the testing device 38 can be present exclusively in the form of a software application, which runs on the microcontroller 40 of the signal processing unit 14. In any event, independently of its respective implementation, the testing device 38 is designed for actuating the first and second switching elements 22, 24.

Between the first switching element 22 and the first output terminal 28, a first read-back tap is situated, identified here by the reference number 42. The first read-back tap 42 constitutes a tap-off, which is coupled to the testing device 38. By means of the tap-off, the testing device 38 can determine the voltage present on the first read-back tap 42. Preferably, the testing device 38 incorporates a threshold value detector, which converts the voltage present on the first read-back tap 42 into a binary signal. Alternatively, the testing device 38 can also incorporate an analogue-digital converter, which converts a voltage present on the first read-back tap 42 into discrete values.

A second read-back tap, which is arranged between the second switching element 24 and the second output terminal 32, is identified here by the reference number 44. The second read-back tap 44 is configured analogously to the first read-back tap 42, and is likewise coupled to the testing device 38.

The testing device 38 is designed for actuating the first and second switching elements 22, 24, and for the simultaneous determination of a read-back signal, preferably a binary signal, on the first and second read-back taps 42, 44. As described in greater detail hereinafter, a test pattern can be generated from the read-back signals.

The safety switching device additionally incorporates an internal consumer 46 and a third switching element 48.

The internal consumer 46 is configured to simulate an external consumer 34. In other words, the internal consumer 46 is an electronic component having the same or similar electrical properties to a preferred external consumer 34. The internal consumer 46 can, for example, be a simple electrical resistor. Alternatively or additionally, the internal consumer 46 can also comprise further electronic components, such as coils or capacitors, in order to simulate the electrical characteristics of an external consumer 34.

In this case, the term "internal" signifies that the consumer is a component of the safety switching device. This does not necessarily mean that the internal consumer, as represented here, must be permanently integrated in the housing 12 of the safety switching device 10. Alternatively, the safety switching device 10 can be provided with terminal connections only, by means of which an "internal" consumer can be made available externally. This would have an advantage, in that the internal consumer can be adapted to an anticipated external consumer. In a further exemplary embodiment, the internal consumer can also be of variable design, such that the testing device 38 varies the electrical properties of the internal consumer, and can adapt said properties as required.

Independently of the configuration of the internal consumer 46, the latter is connectable via the third switching element 48 in parallel with the external consumer 34, i.e. the third switching element 48 and the internal consumer 46 are arranged in series between the first output terminal 28 and the second output terminal 32. Between the third switching element 48 and the internal consumer 46, a third read-back tap is arranged, identified here by the reference number 50. As in the case of the first and second read-back taps 42, 44 described above, a voltage or a specified state can also be determined by the testing device 38 on the third read-back tap 50.

The safety switching device 10 is additionally provided with a memory 52. In the present case, the memory 52 is integrated in the signal processing unit 14. Alternatively, the memory 52 can also be configured as a standalone component, which can be accessed by the testing device 38. In the memory 52, values and assignment tables can be stored, in respect of which searches can be executed by the testing device 38. Specifically, fault patterns are stored in the memory 52, which can be unambiguously assigned to any given fault.

In a simplified representation of the testing of the safety switching device 10 by the testing device 38, the first, second and third switching elements 22, 24, 48 are actuated, and a read-back signal is read back at the first, second and third read-back taps 42, 44, 50 respectively. A test pattern is then generated from the read-back signals, and matched against the fault patterns stored in the memory 52. From this matching process, the functional capability of the safety switching device 10 can be determined, together with the fault type, in the event of a fault.

A simple and a preferred test strategy are described in greater detail hereinafter, with reference to FIGS. 2 to 7.

Figure 2:
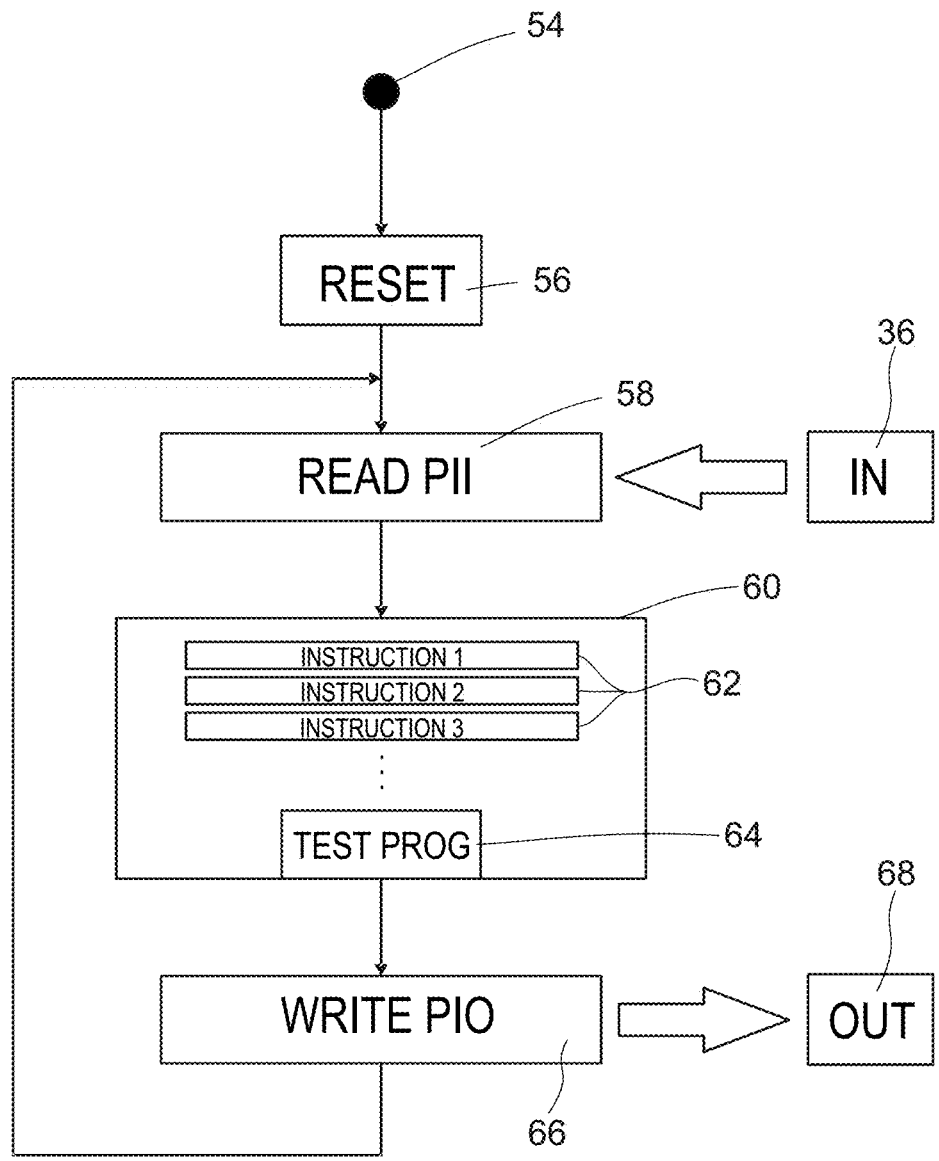
FIG. 2: shows a flow diagram for the cyclical program execution of a (safe) control function.

FIG. 2 shows a flow diagram for the cyclical program execution of a (safe) control function. A safe control function can comprise one or more safety switching devices 10 within the meaning of the present disclosure, or further additional safety switching devices.

In principle, the safe control function described herein operates, in the manner of a normal control function, by the IPO principle (input-process-output). At the start of a new cycle 54, all outputs, timers, counters and markers are set to zero, as indicated here by the reference number 56. Following this reset 56, in step 58 a process image of inputs (PII) is logged, which reflects the input signals delivered at the inputs 36 of the signaling units 16, 18, 20. The PII, together with the current signal states, is saved in a specific control memory for further processing.

Following the input of the PII, the execution of a control program stored in the memory proceeds, represented here by step 60. The control program comprises a plurality of instructions 62, which are executed sequentially, i.e. instruction by instruction. During the execution of instructions, the control function no longer accesses the inputs directly, but only the PII stored in the memory. If, during the running of the program, outputs are adjusted, this occurs initially in a specific memory area, the "process image of outputs" (PIO). Only after the complete execution of the control program is the PIO transferred to the actual outputs.

In this case, the control program additionally comprises a test program 64. The test program 64 can expand the control program by the addition of further instructions 62 only, or can constitute a standalone software component, which is executed further to the final instruction 62 of the control program. Irrespective of the respective embodiment, the test program 64 is configured to collaborate with the aforementioned testing devices within the safety switching device 10, for the execution of tests and the generation and delivery of the corresponding test results. It is understood that the test program 64, as an element of the control program, can execute the direct control of outputs via the PIO or, by means of modifications to the PII, can transmit instructions to the control program which are to be incorporated in the next program cycle. It is not necessary for the test program 64 to be fully completed within one program cycle. A test program 64, once started, can independently encompass the running of a plurality of program cycles.

Further to the final instruction 62, states are transmitted from the PIO to the actual outputs 68. This occurs in step 66. Thereafter, the process is repeated from step 58 onwards, and the read-in of inputs 36 to the PII is repeated.

If the signal state of an input changes during a program cycle, this will only become apparent when the PII is next constituted. As a result, the control function features response times which, in the least favorable case, may be twice as long as the cycle time. Depending upon the length of the control program, the duration of the cycle time can be, for example, 8 milliseconds per 1,000 instructions 62. The execution of the test program can encompass a plurality of PII and PIO cycles, and does not necessarily need to proceed between a PII and a subsequent PIO.

Figure 3:
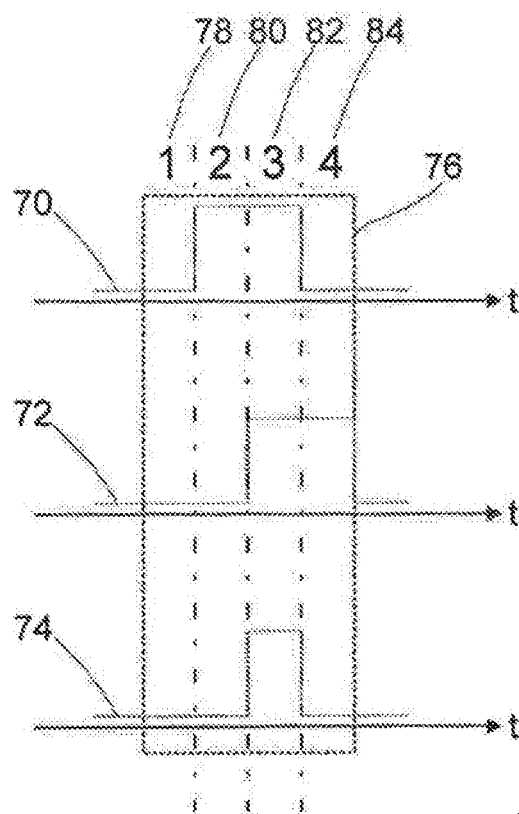
FIG. 3: shows a schematic representation of an exemplary embodiment of a first switching test.

With reference to FIG. 3, a first switching test, of the type executed by the testing device 38, is described in greater detail hereinafter.

In FIG. 3, the respective switching states of the first, second and third switching elements 22, 24, 48 are represented over the time interval t. The upper diagram, identified by reference number 70, represents the switching state of the first switching element 22, the middle diagram, identified by reference number 72, represents the switching state of the second switching element 24, and the third diagram, identified by reference number 74, represents the switching state of the third switching element 48. As can be seen from the first, second and third diagrams 70, 72, 74, a switching element 22, 24, 48 can assume an actuated or a non-actuated state. Here, a specific test period 76 is subdivided into four non-overlapping test intervals 78, 80, 82, 84 of equal length. The division of the test period 76 into four test intervals 78, 80, 82, 84 is preferred. However, within the meaning of the present disclosure, a first switching test can also comprise only three test intervals.

In the present case, in the first test interval 78, neither the first switching element 22, nor the second switching element 24, nor the third switching element 48 is actuated. In the second test interval 80, the first switching element 22 is actuated, whereas the second switching element 24 and the third switching element 48 are not actuated. In the third test interval 82, the first switching element 22 and the second switching element 24 are actuated, together with the third switching element 48. In the fourth test interval 84, the second switching element 24 is actuated, whereas the first switching element 22 and the third switching element 48 are not actuated.

The first test period 76 represents the preferred characteristic of a first switching test within the meaning of the present disclosure. In the preferred first switching test, within the first to fourth test intervals, the switching states of the first and second switching elements 22, 24 are thus fully permutated, whereas the third switching element 48 is only actuated if both the first switching element 22 and the second switching element 24 are actuated. It is understood that the sequence of test intervals 78, 80, 82, 84 represented here is exemplary only. The sequence of test intervals 78, 80, 82, 84 is arbitrary.

In each test interval 78, 80, 82, 84, immediately, or preferably every 100 us, the respective state on the first, second and third read-back taps 42, 44, 50 is determined, and is saved in the memory 52. Further to the completion of the fourth test interval 84, the states read-back in the respective test intervals on the first, second and third read-back taps 42, 44, 50 are combined to form a first test pattern 86, as described in greater detail with reference to FIG. 4.

Figure 4:
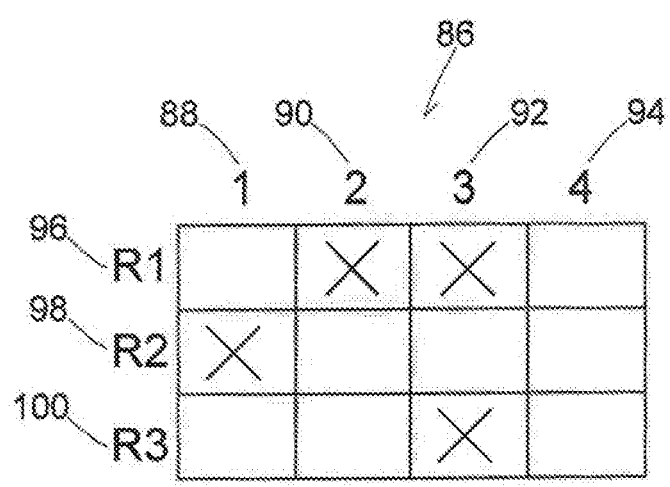
FIG. 4: shows a simplified representation of an exemplary embodiment of a first test pattern.

FIG. 4 shows a schematic representation of an exemplary embodiment of a first test pattern 86. The test pattern 86 is represented here as a matrix, wherein the columns 88, 90, 92, 94 correspond to the first, second, third and fourth test intervals 78, 80, 82, 84. The columns 88, 90, 92, 94 correspond to a triplet, in which the respective states on the first, second and third read-back taps during the corresponding test interval are saved.

In the present exemplary embodiment, the states on the first, second and third read-back taps 42, 44, 50 are recorded as binary states, i.e. a distinction is drawn between a first and second state on the respective read-back tap. In FIG. 4, the first state is represented by a cross in the corresponding field, whereas the second state is represented by a blank field. The rows 96, 98, 100 represent the first, second and third read-back taps 42, 44, 50. The states read back on the first read-back tap 42 in the respective test intervals 78, 80, 82, 84 are thus represented in the first row 96. The second row 98 represents the corresponding states on the second read-back tap 44, and the third row 100 represents the states on the third read-back tap 50 during the respective test intervals. If the read-back signals on the first, second and third read-back taps 42, 44, 50 relate to binary states, the test pattern 86 can be represented in an exceptionally simple manner as a bit field. A bit field, which represents the test pattern presented in the table, is identified here by the reference number 102. Each bit in the bit sequence represents a state on a read-back tap during a test interval. As indicated above, the test intervals can also be executed in a sequence other than that represented here. The sequence of states in the test pattern will then be altered accordingly.

It is understood that, in other exemplary embodiments, the read-back signals on the first, second and third read-back taps 42, 44, 50 can also assume more than two states. In this case, the test pattern 86 would then be constituted as a sorted sequence of symbols which represent these individual states. The various symbols which represent the different states can, in turn, be represented in a binary system wherein, in this case, the bit field 102 would simply be extended.

Immediately a first test pattern 86 has been generated, further to the completion of the first test period 76, the testing device 38 matches the first test pattern 86 with a first error pattern set, in order to identify a fault on the safety switching device 10. In other words, the testing device executes a search, in a table of fault patterns, for a pattern which corresponds to the test pattern, wherein each fault pattern is unambiguously associated with a given fault. If no fault pattern for the test pattern can be identified, the fault is undefined, i.e. no known fault can be assigned to the test pattern.

It is also possible that the error pattern set includes one or more patterns which represent a "good case". A "good case" describes a test pattern which represents a fault-free state of the safety switching device, i.e. a state in which it is positively established that the first and second switching elements are operating in a fault-free manner, and no internal fault is present. Preferably, in a "good case", both an internal and an external fault can be ruled out.

Figure 5:
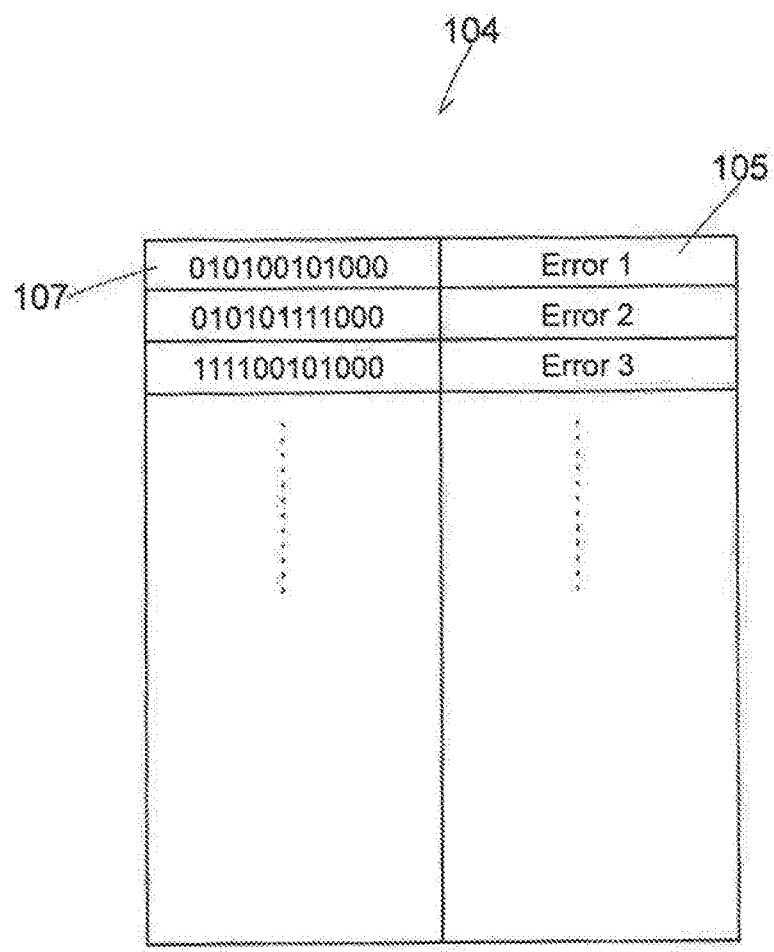
FIG. 5: shows a schematic representation of an exemplary embodiment of a first error pattern set.

FIG. 5 represents an exemplary first error pattern set 104. Essentially, the first error pattern set corresponds to an assignment table, which is saved in the memory 52. In the table, a corresponding fault is assigned to each known fault pattern. Preferably, for each switching test within the meaning of the present disclosure, a dedicated set of fault patterns is available.

The testing device 38 is configured to identify the test pattern 86 constituted in the first test period 76 from a first error pattern set 104 and, where present, to provide indication of a corresponding fault 105, or to initiate measures which are appropriate to said fault.

The first error pattern set 104 can be under-determined, i.e. not every potential pattern 107 is saved in the error pattern set 104, but only those patterns to which an unambiguous fault can be assigned. If a fault pattern 86 is not listed in a first error pattern set 104, no unambiguous fault can be identified. In this case, preferably, a second switching test is executed in which, within a second test period, the first, second and third switching elements 22, 24, 48 are switched to different states, such that a second test pattern can be determined which, in turn, can be matched with a second error pattern set. A preferred test strategy of this type is described in greater detail with reference to FIGS. 6 and 7.

Figure 6:
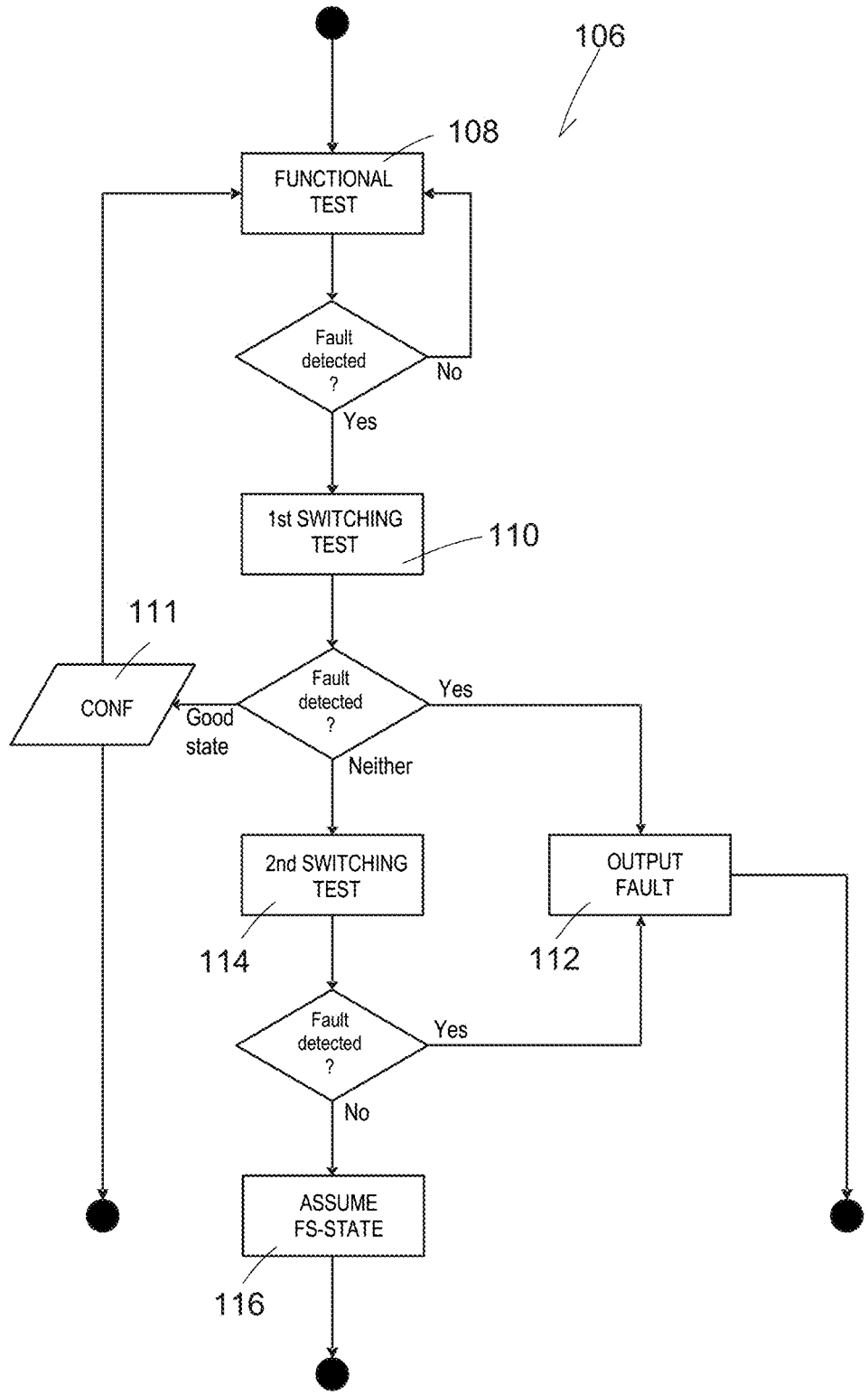
FIG. 6: shows a flow diagram for a preferred test sequence.

FIG. 6 shows a flow diagram of a preferred test sequence 106.

In the preferred test sequence 106, a functional test 108 is firstly executed, in order to test the functional capability of the first and second switching elements 22, 24.

In the functional test 108, the first and second switching elements 22, 24 are checked for functional capability, wherein the testing device 38 actuates the first and second switching elements 22, 24 in an alternating manner. In the functional test 108, preferably, a complete test pattern within the meaning of the present disclosure is not generated but, immediately after actuating the first or second switching elements 22, 24, a read-back signal is tapped from the corresponding first or second read-back taps 42, 44, and is compared directly with an anticipated value.

The functional test is executed, regardless of the current state of the switching elements 22, 24, or the process image of outputs. Preferably, the functional test 108 is executed once in each of the program cycles described in FIG. 2. It is specifically preferred that, in each cycle, only one of the first or second switching elements 22, 24 is tested respectively, wherein the other respective element is tested in the following cycle. Alternatively, in one cycle, the first and second switching elements 22, 24 can also be tested sequentially. The duration of execution of the switching test 110, 114 can also encompass a number of program cycles. Accordingly, the result of a switching test will not necessarily be available after each program cycle.

For each switching state of the first or second switching elements 22, 24, in the functional test, there is a specific expectancy for the read-back signals which are tapped-off at the first read-back tap and the second read-back tap 42, 44. If the read-back signals match these specific expectancies, the test sequence 106 is terminated, and the cyclical program execution continues in accordance with FIG. 2, i.e. a further functional test 108 is executed in the next cycle.

If the read-back signals do not match these expectancies, a fault is present, wherein the nature of the fault cannot be identified from the functional test 108 itself. If a fault is present, a first switching test 110 is executed thereafter, wherein the first switching test 110 corresponds to a first switching test of the type described with reference to FIG. 3.

In a first switching test 110, all potential combinations of the switching states of the first and second switching elements 22, 24 are tested. However, the internal consumer 46 is only switched-in intermittently. For each combination, there is an expectancy for the read-back signals on the first, second and third read-back taps 42, 44, 50. From the read-back signals, following the first test period 76, a test pattern 86 is generated, of the type described with reference to FIG. 4, and is matched with a first error pattern set 104, in order to permit the identification of an unambiguous fault 105. If an unambiguous fault can be identified for the test pattern, said fault is then notified in step 112.

The test pattern 86 can also correspond to a "good case". In this case, neither external nor internal faults are present. In this case, depending upon the configuration 111, the previous result of the functional test can be ignored or, preferably, the functional test 108 can be executed again.

In addition to the fault output 112 and the signaling of the fault detected, further measures can also be implemented immediately. For example, the fault output 112 can exercise a direct influence upon the PIO or, by means of the setting of a bit in the PII, the corresponding fault can be transmitted to the control program of the safety control function. If, for example, the fault identified in the first switching test 110 corresponds to a load interruption, i.e. a state in which the external consumer 34 is isolated from the safety switching device 10, this state can be notified to the safe control function, without the need for the safety switching device 10 itself to assume a safe state. This is particularly advantageous, as superior availability can thus be ensured, in that an external fault does not immediately result in the assumption of a fail-safe state 116, with the blocking of the safety switching device until further notice.

According to this preferred test strategy, if the absence of a fault, or a "good case", is unambiguously identified in the first switching test 110, this is followed by a second switching test 114, rather than a fault output 112. In the second switching test 114, a second test pattern is generated, wherein the first, second and third switching elements 22, 24, 48, in a minimum of three test intervals, are switched to various switching states and, during these test intervals, read-back signals are tapped-off on the first, second and third read-back taps 42, 44, 50. Thereafter, the second test pattern is matched with a second error pattern set, in order to permit the identification of an unambiguous fault. If a fault can be unambiguously identified, a fault output then proceeds in accordance with step 112.

If no unambiguous fault can be assigned to the second test pattern, an internal defect is assumed, and the safety switching device 10 is switched to a fail-safe state, in step 116. In general, this means that the safe control function assumes a safety mode, in which a person or objects in the vicinity of the installation to be monitored are no longer exposed to a hazard. Customarily, this involves the switch-out of all the outputs 68 of the safe control function.

Preferably, the second switching test 114 is also divided into four temporally separated intervals, during which the first and second switching elements 22, 24 assume all potential switching states in respect of each other, whereas the third switching element 48 is actuated continuously. As in the first switching test 110, all switching states are comprehensively permutated, wherein the internal consumer 46 is continuously connected in parallel with the output terminals 28, 32. By the second switching test 114, in the event of a load interruption, the presence of a short-circuit or cross-connection can additionally be identified. Specifically, by means of the second switching test 114, the diagnostic capability of the safety switching device is thus advantageously enhanced, as the differentiation of faults can be further improved.

Figure 7:
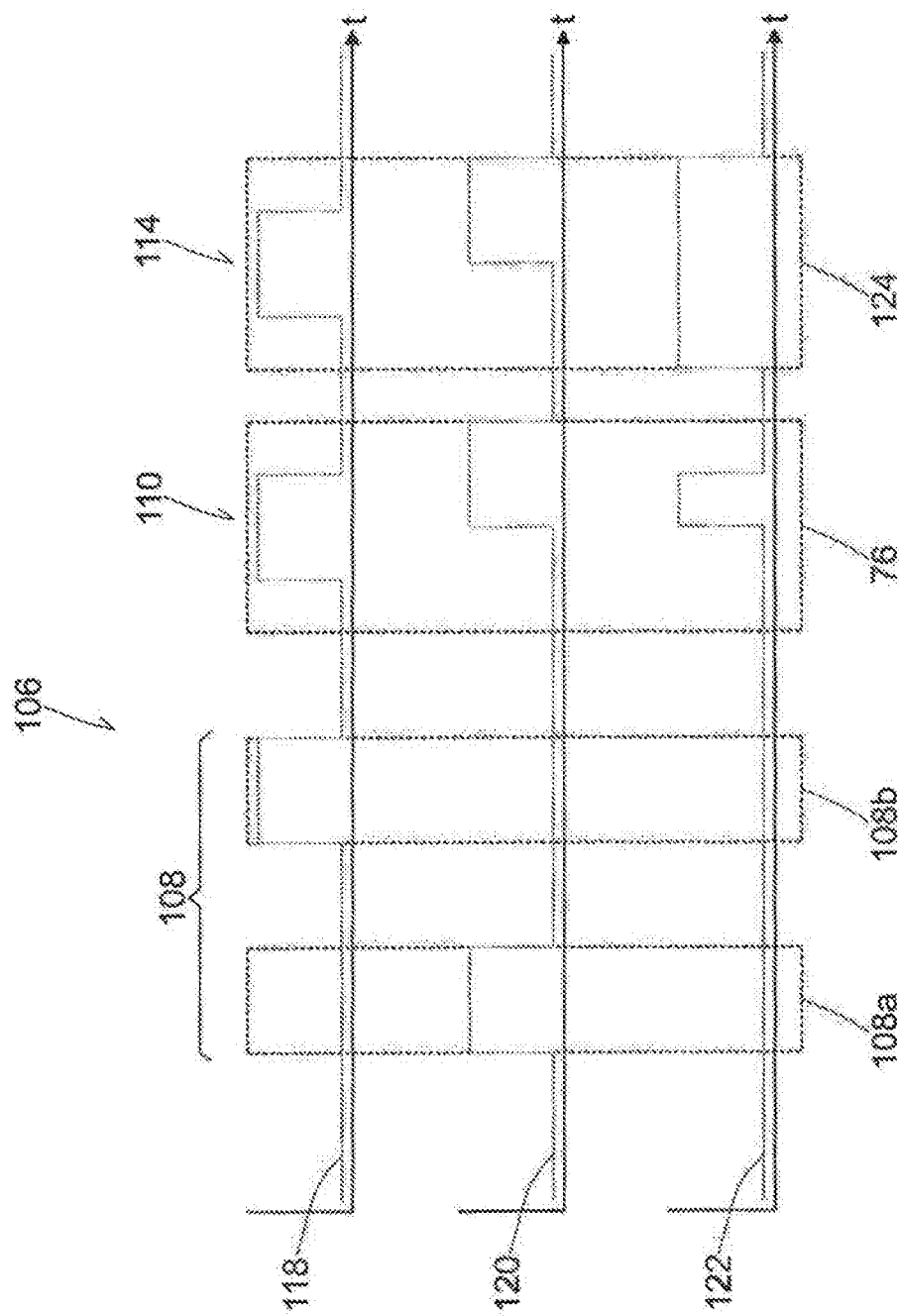
FIG. 7: shows a schematic representation of a preferred test sequence.

With reference to FIG. 7, the switching states of the first, second and third switching elements 22, 24, 48 during the preferred test sequence 106 are described in greater detail hereinafter. In FIG. 7, the switching states of the first, second and third switching elements 22, 24, 48 are plotted against time t. The upper diagram 118 represents the switching state of the first switching element 22 in the preferred test sequence 106, the middle diagram 120 represents the switching state of the second switching element 24 within the preferred test sequence 106, and the lower diagram 122 represents the switching state of the third switching element 48 within the preferred test sequence 106.

The test sequence commences with a functional test 108 which, in this case, is executed in two phases 108a, 108b. In the first phase 108a, the second switching element 24 is actuated, whereas the first switching element 22 and the third switching element 48 are not actuated. Simultaneously, on the second read-back tap 44, a read-back signal is tapped-off and compared with an anticipated value. If the signal read back in the first phase 108a does not match a corresponding expectancy, the first switching test 110 then proceeds immediately, i.e. the second phase 108b represented here is omitted. Conversely, if the read-back signal matches the specified expectancy, the second phase 108b of the functional test 108 is executed, either in the same program cycle or, alternatively, in the following program cycle.

In the second phase 108b, the first switching element 22 is actuated, whereas the second switching element 24 and the third switching element 48 are not actuated. Simultaneously, on the first read-back tap 42, a read-back signal is tapped-off and compared with a specified expectancy. If the signal read-back matches the expectancy, the test sequence 106 is terminated, and the next cycle commences with a further functional test 108. In other words, a functional test 108 will only be executed by the testing device 38 until such time as a fault is detected by the functional test 108, which will be identified more closely in the subsequent switching tests 110, 114.

If the read-back signal in the first or second phase 108a, 108b does not match the specified expectancy, a first switching test 110 is executed immediately after the functional test 108. In the first switching test 110, in this preferred exemplary embodiment, all potential combinations of switching states of the first and second switching elements 22, 24 are tested. The third switching element 48 is only actuated if the first and second switching elements 22, 24 are actuated. Otherwise, the third switching element 48 is not actuated. At the end of the first test period 76, a test pattern 86 is generated from the read-back signals received in the individual intervals of the first test period 76, and is compared with a first error pattern set 104, in order to identify a fault.

If neither a fault nor a "good state" can be unambiguously assigned to the first test pattern 86 generated further to the first test period 76, a second switching test 114 is executed immediately thereafter.

In the second switching test 114, as in the first switching test 110, preferably in four test intervals, all potential combinations of switching states of the first and second switching elements 22, 24 are tested, whereas the third switching element 48 is actuated throughout the entire second test period 124. In other words, in the second switching test 114, all the switching states of the first and second switching states are comprehensively permutated, whereas the internal consumer 46 is permanently switched-in.

Following the second test period 124, a second test pattern is generated and matched with a second error pattern set, in order to permit the unambiguous identification of a fault. Specifically, the second switching test 114 permits the identification of faults which can occur in tandem with a load interruption. Thus, for example, in the presence of a load interruption, the presence of a short-circuit on the switching elements can additionally be determined. Accordingly, further faults can be identified, thereby permitting the more effective diagnosis of fault conditions.

If the test pattern generated in the second test period 124 cannot be unambiguously assigned to a given fault, an internal (unknown) defect is present on the safety switching device 10 and, in this case, the safety switching device 10 must be switched immediately to a fail-safe state 116. Advantageously, this will only occur if known and commonplace faults can be ruled out. In the second test period according to the present exemplary embodiment, a "good case" can no longer be detected.

It is understood that the test sequence 106 represents a preferred test sequence. In a preferred exemplary embodiment, depending upon the configuration, individual switching tests can be omitted, or specific combinations thereof only can be waived. In consequence, although only a restricted fault diagnosis will be possible, this also permits the safety switching device to be employed for external consumers, in which specific combinations of switching states are technically not possible. By means of the configuration facility, the novel safety switching device can thus be advantageously employed for a plurality of different external consumers 34.

Using the preferred test sequence 106, in the first switching test 110, the following faults can specifically be identified and distinguished: a load interruption, short-circuit on the individual switching elements 22, 24, 48 or a cross-connection to the same potential, cross-connections on the first and second switching elements to a different potential, the interruption of a switching element 22, 24, 48 and a short-circuit on the external consumer 34, or an overload of the external consumer 34.

Additionally, by means of the second switching test 114, in the event of a load interruption, the other aforementioned faults, i.e. specifically short-circuits and cross-connections can be identified. Advantageously, a fault detected can be referred to the control program for further processing. For example, in the event of a load interruption, a bit can be set on the PII which will be considered by the control program in the next program cycle.

By means of the novel switching test, in addition to a load interruption, all other commonplace faults can be unambiguously identified, and a distinction can also be drawn between the presence of an internal or external fault. This is specifically relevant for the availability of the safety switching device 10 on the grounds that, in principle, external faults can be cleared, and there is no necessity for the assumption of a fail-safe state by the safety switching device 10. Moreover, in tandem with a load interruption, all other faults can be identified. For example, in the event of a load interruption, a cross-connection of the outputs can additionally be detected.

By means of the novel method, faults such as cross-connections (external faults), short-circuits and interruptions on the first or second switching elements 22, 24, and on the connected external consumer 34, can be detected. Only if no fault can be unambiguously identified, and a "good case" cannot be assumed, is an internal (unknown) fault diagnosed. The availability of the safety switching device can thus be advantageously enhanced.

What is claimed is:

1. A safety switching device for fail-safe disconnection of an external consumer having a first pole and a second pole, the safety switching device comprising:
   a first terminal for receiving a first potential,
   a second terminal for receiving a second potential,
   a first switching element arranged between the first terminal and the first pole of the external consumer,
   a second switching element arranged between the second terminal and the second pole of the external consumer,
   a signal processing unit for receiving a switch-off signal via an input and for actuating the first and second switching element in accordance with the switch-off signal,
   an internal consumer, and
   a third switching element for connecting in parallel the internal consumer with the external consumer,
   wherein a first read-back tap is arranged between the first switching element and the first pole, a second read-back tap is arranged between the second switching element and the second pole, and a third read-back tap is arranged between the third switching element and the internal consumer,
   wherein the signal processing unit comprises a testing device and a memory, in which a first error pattern set is stored,
   wherein the testing device is coupled to the first, second and third read-back taps and is configured to execute a first switching test having a minimum of three mutually temporally-separated test intervals,
   wherein the testing device is configured to receive, in each test interval of the test intervals, a read-back signal from the first, second and third read-back taps respectively in order to generate a first test pattern, and
   wherein the testing device is further configured to find a match of the first test pattern within the first error pattern set, in order to identify a fault.

2. The safety switching device of claim 1, wherein the testing device is further configured to vary, after each of the test intervals, at least one switching state of the first, second or third switching elements.

3. The safety switching device of claim 1, wherein a fault type is uniquely assigned to each fault pattern in the first error pattern set.

4. The safety switching device of claim 3, wherein the testing device is configured to generate a fault signal, which represents the fault type, based on the first switching test, if a fault is unambiguously identified by the first switching test.

5. The safety switching device of claim 1, wherein the first test pattern is a bit field.

6. The safety switching device of claim 1, wherein the testing device is configured to find a match of the first test pattern within a further pattern set, in order to identify fault-free operation.

7. The safety switching device of claim 1, wherein the first switching test comprises four mutually temporally-separated test intervals.

8. The safety switching device of claim 7, wherein the testing device is further configured to, for the first switching test:
   in a first interval of the test intervals, actuate neither the first nor the second switching element,
   in a second interval of the test intervals, actuate only the first switching element,
   in a third interval of the test intervals, actuate only the second switching element, and
   in a fourth interval of the test intervals, actuate the first and the second switching element.

9. The safety switching device of claim 8, wherein the third switching element is only actuated in the fourth interval.

10. The safety switching device of claim 1, wherein the first switching test is configurable with respect to the number of the test intervals.

11. The safety switching device of claim 1, wherein the testing device is configured to execute a functional test, which precedes the first switching test.

12. The safety switching device of claim 11, wherein the testing device is configured to:
   actuate sequentially, for the functional test, the first switching element and the second switching element;
   upon actuating the first switching element, by means of a read-back at the first read-back tap, determine functional capability of the first switching element; and
   upon actuating the second switching element, by means of a read-back at the second read-back tap, determine functional capability of the second switching element.

13. The safety switching device of claim 11, wherein the testing device is configured to execute the first switching test only in response to detection of a fault in the functional test.

14. The safety switching device of claim 1, wherein the testing device is configured to execute, further to the first switching test, a second switching test, in order to generate a second test pattern in the event that, further to the first switching test, no fault has been unambiguously identified.

15. The safety switching device of claim 14, wherein the testing device is configured to, for the second switching test:
in a first interval of the test intervals, actuate neither the first nor the second switching element,
in a second interval of the test intervals, actuate only the first switching element,
in a third interval of the test intervals, actuate only the second switching element, and
in a fourth interval of the test intervals, actuate the first and second switching element,
wherein, in the first, second, third and fourth interval, the third switching element is actuated.

16. The safety switching device of claim 14, wherein:
a second error pattern set is stored in the memory, and
the testing device is configured to find a match of the second test pattern within the second error pattern set, in order to permit unambiguous identification of a fault.

17. The safety switching device of claim 14, wherein the testing device is configured to generate a fault signal, which represents a fault type, based on the second switching test, if no fault has been unambiguously identified by the first switching test.

18. The safety switching device of claim 17, wherein the fault type represents an internal hardware fault, if no fault is unambiguously identified by the second switching test.

19. A method for fail-safe disconnection of an external consumer having a first pole that is coupled, via a first switching element, to a first terminal for receiving a first potential, and having a second pole that is coupled, via a second switching element, to a second terminal for receiving a second potential, the method comprising:
receiving a switch-off signal;
actuating the first and second switching elements, in accordance with the switch-off signal;
providing an internal consumer and a third switching element, wherein the internal consumer, by actuating the third switching element, is connected in parallel with the external consumer;
providing a first, a second and a third read-back tap between the first, second and third switching elements and the external and internal consumers;
providing a first error pattern set;
executing a first switching test over a minimum of three mutually temporally-separated time intervals;
generating a first test pattern by the read-back of one read-back signal respectively on the first, second and third read-back taps in each of the time intervals; and
identifying a fault by finding a match of the first test pattern within the first error pattern set.

* * * * *